US006583441B2

(12) United States Patent
Moradi et al.

(10) Patent No.: US 6,583,441 B2
(45) Date of Patent: Jun. 24, 2003

(54) CAPACITOR CONSTRUCTIONS COMPRISING A NITROGEN-CONTAINING LAYER OVER A RUGGED POLYSILICON LAYER

(75) Inventors: Behnam Moradi, Boise, ID (US); Er-Xuan Ping, Meridian, ID (US); Lingyi A. Zheng, Boise, ID (US); John Packard, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/997,620

(22) Filed: Nov. 29, 2001

(65) Prior Publication Data

US 2002/0066920 A1 Jun. 6, 2002

Related U.S. Application Data

(62) Division of application No. 09/651,818, filed on Aug. 30, 2000.

(51) Int. Cl.$^7$ .............................................. H01L 27/108
(52) U.S. Cl. ........................................ 257/68; 257/71
(58) Field of Search .............................. 257/68, 71, 66; 316/298.3, 299.5

(56) References Cited

U.S. PATENT DOCUMENTS

| 4,254,161 A | 3/1981 | Kemlage |
| 4,585,516 A | 4/1986 | Corn et al. |
| 4,882,649 A | 11/1989 | Chen et al. |
| 4,891,684 A | 1/1990 | Nishioka et al. |
| 4,996,081 A | 2/1991 | Ellul et al. |
| 5,039,388 A | 8/1991 | Miyashita et al. |
| 5,051,794 A | 9/1991 | Mori |
| 5,052,339 A | 10/1991 | Vakerlis et al. |
| 5,102,523 A | 4/1992 | Beisswenger et al. |
| 5,142,438 A | 8/1992 | Reinberg et al. |
| 5,147,493 A | 9/1992 | Nishimura et al. |

(List continued on next page.)

FOREIGN PATENT DOCUMENTS

| EP | 0 552 491 | 7/1993 |
| EP | 0 641 150 | 3/1995 |
| EP | 0 678 903 | 10/1995 |

(List continued on next page.)

OTHER PUBLICATIONS

Rayner, J. et al., "Radio Frequency Matching for Helicon Plasma Sources", J. Vac. Sci. Technol. A 14(4), Jul./Aug. 1996, pp. 2048–2055.

Primary Examiner—Michael S. Lebentritt
Assistant Examiner—Brad Smith
(74) Attorney, Agent, or Firm—Wells St. John P.S.

(57) ABSTRACT

The invention encompasses a method of forming a dielectric material. A nitrogen-comprising layer is formed on at least some of the surface of a rugged polysilicon substrate to form a first portion of a dielectric material. After the nitrogen-comprising layer is formed, at least some of the substrate is subjected to dry oxidation with one or both of NO and $N_2O$ to form a second portion of the dielectric material. The invention also encompasses a method of forming a capacitor. A layer of rugged silicon is formed over a substrate, and a nitrogen-comprising layer is formed on the layer of rugged silicon. Some of the rugged silicon is exposed through the nitrogen-comprising layer. After the nitrogen-comprising layer is formed, at least some of the exposed rugged silicon is subjected to dry oxidation conditions with one or both of NO and $N_2O$. Subsequently, a conductive material layer is formed over the nitrogen-comprising layer. Additionally, the invention encompasses a capacitor structure. The structure includes a first capacitor electrode comprising a rugged polysilicon layer, a nitrogen-comprising layer on the rugged polysilicon layer, and a second capacitor electrode. The nitrogen-comprising layer is between the first and second capacitor electrodes.

15 Claims, 3 Drawing Sheets

U.S. PATENT DOCUMENTS

| | | |
|---|---|---|
| 5,230,931 A | 7/1993 | Yamazaki et al. |
| 5,260,236 A | 11/1993 | Petro et al. |
| 5,261,962 A | 11/1993 | Hamamoto et al. |
| 5,272,417 A | 12/1993 | Ohmi |
| 5,324,679 A | 6/1994 | Kim et al. |
| 5,376,593 A | 12/1994 | Sandhu et al. |
| 5,433,786 A | 7/1995 | Hu et al. |
| 5,439,524 A | 8/1995 | Cain et al. |
| 5,468,296 A | 11/1995 | Patrick et al. |
| 5,498,890 A | 3/1996 | Kim et al. |
| 5,504,029 A | 4/1996 | Murata et al. |
| 5,508,542 A | 4/1996 | Geiss et al. |
| 5,523,596 A | 6/1996 | Ohi et al. |
| 5,567,267 A | 10/1996 | Kazama et al. |
| 5,605,637 A | 2/1997 | Shan et al. |
| 5,607,542 A | 3/1997 | Wu et al. |
| 5,656,123 A | 8/1997 | Salimian et al. |
| 5,661,072 A | 8/1997 | Jeng |
| 5,665,167 A | 9/1997 | Deguchi et al. |
| 5,716,534 A | 2/1998 | Tsuchiya et al. |
| 5,731,235 A | 3/1998 | Srinivasan et al. |
| 5,844,771 A | 12/1998 | Graettinger et al. |
| 5,851,603 A | 12/1998 | Tsai et al. |
| 5,863,339 A | 1/1999 | Usami |
| 5,865,937 A | 2/1999 | Shan et al. |
| 5,900,103 A | 5/1999 | Tomoyasu et al. |
| 5,919,332 A | 7/1999 | Koshiishi et al. |
| 5,942,075 A | 8/1999 | Nagahata et al. |
| 5,985,738 A | 11/1999 | Jang et al. |
| 6,001,748 A | 12/1999 | Tanaka et al. |
| 6,037,220 A * | 3/2000 | Chien et al. ............. 438/398 |
| 6,048,769 A | 4/2000 | Chau |
| 6,051,510 A | 4/2000 | Fulford, Jr. et al. |
| 6,063,713 A | 5/2000 | Doan |
| 6,093,617 A * | 7/2000 | Su et al. ............... 438/255 |
| 6,093,661 A | 7/2000 | Trivedi et al. |
| 6,111,744 A | 8/2000 | Doan |
| 6,112,697 A | 9/2000 | Sharan et al. |
| 6,127,221 A * | 10/2000 | Lin et al. ............... 438/255 |
| 6,150,278 A * | 11/2000 | Tan et al. ............... 438/706 |
| 6,159,867 A | 12/2000 | Sharan et al. |
| 6,218,260 B1 | 4/2001 | Lee et al. |
| 6,227,141 B1 | 5/2001 | Sharan et al. |
| 6,235,646 B1 | 5/2001 | Sharan et al. |
| 6,486,020 B1 | 11/2002 | Thakur et al. |

FOREIGN PATENT DOCUMENTS

| | | |
|---|---|---|
| EP | 0 686 708 | 12/1995 |
| EP | 0 742 577 | 11/1996 |
| EP | 0 776 991 | 6/1997 |
| EP | 0 831 679 | 3/1998 |
| FR | 2 663 806 | 12/1991 |
| JP | 5-175163 | 12/1991 |
| WO | WO 89/02695 | 3/1989 |
| WO | WO 95/32315 | 11/1995 |
| WO | WO 98/32154 | 7/1998 |

* cited by examiner

CAPACITOR CONSTRUCTIONS COMPRISING A NITROGEN-CONTAINING LAYER OVER A RUGGED POLYSILICON LAYER

RELATED PATENT DATA

This patent resulted from a divisional of U.S. patent application Ser. No. 09/651,818, which was filed on Aug. 30, 2000.

TECHNICAL FIELD

The invention pertains to methods of forming dielectric materials, and methods of forming capacitors. The invention also pertains to capacitor constructions.

BACKGROUND OF THE INVENTION

It is frequently desired to form dielectric materials during semiconductor device fabrication. For instance, capacitor constructions comprise dielectric material separating a pair of capacitor electrodes. Suitable dielectric materials for capacitor constructions include silicon dioxide and silicon nitride, with an exemplary dielectric material comprising a stack of silicon nitride between a pair of silicon dioxide layers.

An advantage of utilizing silicon nitride in capacitor constructions is that it has a higher dielectric constant than silicon dioxide. However, a difficulty in utilizing silicon nitride can occur in attempting to get a uniform coating of silicon nitride over a capacitor electrode. For instance, a capacitor electrode can comprise conductively-doped rugged silicon (for example, conductively-doped hemispherical grain polysilicon). Such rugged silicon has a rough surface texture, and is utilized because the rough surface texture enables more conductive surface area to be provided over a particular footprint than would be provided with a smooth-surfaced structure. A difficulty can occur in attempting to form silicon nitride over the roughened surface structure of rugged silicon. Specifically, silicon nitride is typically provided by chemical-vapor deposition (such as, for example, low pressure chemical vapor deposition utilizing silane and ammonia as precursors), and the nitride deposits non-conformally on the roughed surface of the rugged silicon. Accordingly, if the nitride is provided as a thin layer (less than 100 Å thick), there can be pinholes extending into the nitride, and even extending through the nitride to expose portions of the underlying rugged silicon surface.

Among the methods which have been developed to compensate for the pinhole problems are methods in which silicon dioxide is formed over the layer of silicon nitride to either fill the pinholes or at least cover the pinholes with a dielectric material. The silicon dioxide can be formed by either chemical vapor deposition, or by oxidation of the silicon nitride surface.

Another method for compensating for pinhole problems is to form silicon dioxide over the rugged polysilicon prior to formation of the silicon nitride. Accordingly, a dielectric material will be beneath the silicon nitride, and any pinholes extending through the silicon nitride can be prevented from exposing the underlying conductive substrate by the intervening layer of silicon dioxide.

In typical prior art processing, both of the above-discussed silicon dioxide methodologies are utilized. In other words, a layer of silicon dioxide is formed before forming the layer of silicon nitride, and a second layer of silicon dioxide is formed after forming the layer of silicon nitride.

It would be desirable to develop methods wherein some or all of the above-discussed difficulties associated with formation of silicon nitride could be eliminated, and particularly it would be desirable to develop methods wherein one or both of the above-discussed layers of silicon dioxide could be eliminated from capacitor constructions.

SUMMARY OF THE INVENTION

In one aspect, the invention encompasses a method of forming a dielectric material. A nitrogen-comprising layer is formed on at least some of the surface of a rugged polysilicon substrate to form a first portion of a dielectric material. After the nitrogen-comprising layer is formed, at least some of the substrate is subjected to dry oxidation with one or both of NO and $N_2O$ to form a second portion of the dielectric material.

In another aspect, the invention encompasses a method of forming a capacitor. A layer of rugged silicon is formed over a substrate, and a nitrogen-comprising layer is formed on the layer of rugged silicon. Some of the rugged silicon is exposed through the nitrogen-comprising layer. After the nitrogen-comprising layer is formed, at least some of the exposed rugged silicon is subjected to dry oxidation conditions with one or both of NO and $N_2O$. Subsequently, a conductive material layer is formed over the nitrogen-comprising layer.

In yet another aspect, the invention encompasses a capacitor structure. The structure includes a first capacitor electrode comprising a rugged polysilicon layer, a nitrogen-comprising layer on the rugged polysilicon layer, and a second capacitor electrode. The nitrogen-comprising layer is between the first and second capacitor electrodes.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
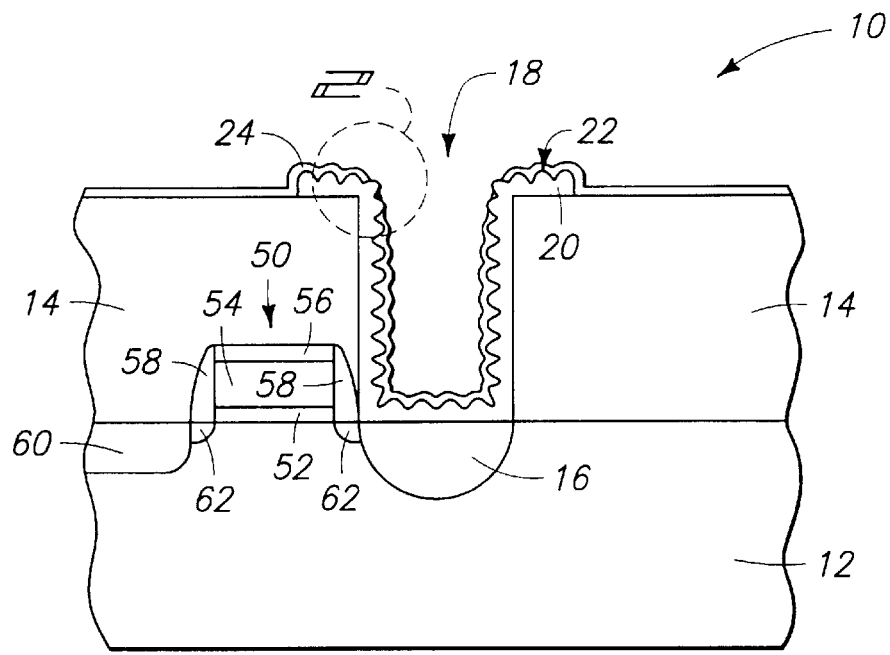
FIG. 1 is a diagrammatic, fragmentary, cross-sectional view of a semiconductor wafer fragment at a preliminary processing step of a method of the present invention.

An exemplary method of the present invention is described with reference to FIGS. 1–6. Referring initially to FIG. 1, a semiconductor wafer fragment 10 is illustrated at a preliminary processing step of a method of the present invention. Wafer fragment 10 comprises a substrate 12 having an insulative material 14 provided thereover. Substrate 12 can comprise, for example, monocrystalline silicon lightly doped with a p-type background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative material 14 can comprise, for example, borophosphosilicate glass (BPSG).

A conductively doped diffusion region 16 is provided within substrate 12, and defines an electrical node. Diffusion region 16 can be doped with either n-type or p-type conductivity-enhancing dopant. Wafer fragment 10 further comprises a transistor structure 50 comprising a gate oxide 52, a conductive material 54 and an insulative cap 56. Conductive material 54 can comprise, for example, one or both of conductively doped silicon and metal silicide, and in typical configurations comprises a layer of conductively doped polysilicon beneath a layer of metal silicide. Layers 52, 54 and 56 comprise sidewalls, and spacers 58 are formed along such sidewalls. Spacers 58 can comprise, for example, anisotropically etched silicon nitride. In the shown embodiment, electrical node 16 is a source/drain region of transistor structure 50, and another source/drain region 60 is shown gatedly connected with electrical node 60. Source/drain regions 16 and 60 comprise heavily-doped regions, (i.e., regions doped to at least a concentration of $1 \times 10^{19}$ atoms/cm$^3$ with conductivity-enhancing dopant). Lightly doped diffusion regions 62 extend beneath sidewall spacers 58, with lightly doped diffusion regions 62 being less heavily doped than source/drain regions 16 and 60. Transistor structure 50 can be formed by conventional methods.

An opening 18 extends through insulative material 14 and to electrical node 16. A first capacitor electrode 20 extends within opening 18, and comprises conductively-doped rugged silicon, such as, for example, conductively-doped hemispherical grain polysilicon. Conductive material 20 can be formed by conventional methods, and is shown patterned into a structure which extends over a top surface of insulative material 14, and within opening 18 to contact electrical 11 node 16. Material 20 comprises a roughened outer surface 22.

Figure 2:
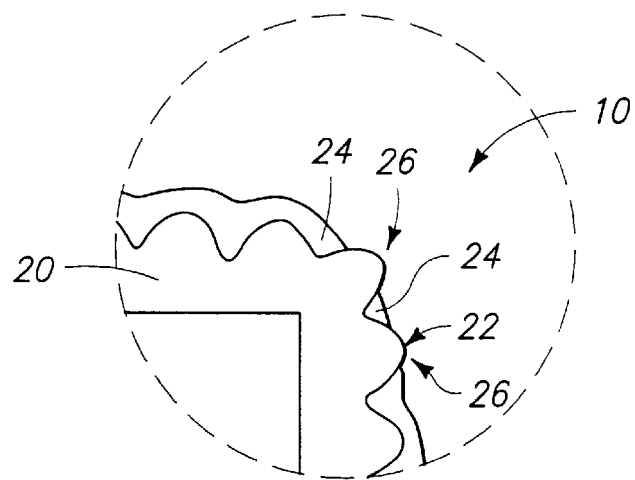
FIG. 2 is an exploded view of a portion of the FIG. 1 wafer fragment.

A nitrogen-comprising layer 24 is formed over roughened surface 22. Nitrogen-comprising layer 24 can comprise, for example, silicon nitride, and can be formed by, for example, chemical vapor deposition. For instance, nitrogen-comprising layer 24 can be formed utilizing low pressure chemical vapor deposition with silane and ammonia as precursors. Layer 24 is preferably formed to a thickness of less than about 60 Å, and can be formed to an exemplary thickness of from about 40 Å to about 60 Å. Due to problems discussed above in the "Background" section of this disclosure, layer 24 does not have a uniform thickness across roughened surface 22. Accordingly, layer 24 has some regions which are relatively thin, and other regions which are relatively thick. Further, layer 24 can have openings extending therethrough to expose some of the underlying conductive material of first electrode 22. Such is illustrated in FIG. 2, which shows an exploded view of a portion of the FIG. 1 structure. Specifically, FIG. 2 shows nitrogen-comprising layer 24 covering only portions of conductive material 20, and leaving other portions (labeled as portions 26 in FIG. 2) exposed through openings in nitrogen-comprising layer 24. It is noted that even though the exposed portions 26 are shown resulting from non-conformal coating of nitrogen-comprising layer 24 over corners, exposed portions of conductive material 20 can also result from pinholes (not shown) extending through layer 24.

Although nitrogen-comprising layer 24 is shown formed on conductive material 20, it is to be understood that the invention encompasses other embodiments (not shown) wherein a dielectric material is formed over conductive material 20 prior to formation of nitrogen-comprising layer 24. For instance, a layer of silicon dioxide could be formed over conductive material 20 prior to provision of nitrogen-comprising layer 24. Such layer of silicon dioxide can be formed by chemical vapor deposition, or by oxidation. In some embodiments, the layer of silicon dioxide can be a "native" layer, formed by exposure of a silicon-containing surface to air. In the shown embodiment, there is no native oxide over surface 22 when nitride layer 24 is deposited. Such can be accomplished by either avoiding exposure of surface 22 to conditions which form native oxide, or by removing native oxide (by, for example, a hydrofluoric acid dip) prior to formation of layer 24. It can be advantageous to avoid having a silicon dioxide layer between nitride layer 24 and surface 22, as silicon dioxide has a lower dielectric constant than silicon nitride.

Figure 3:
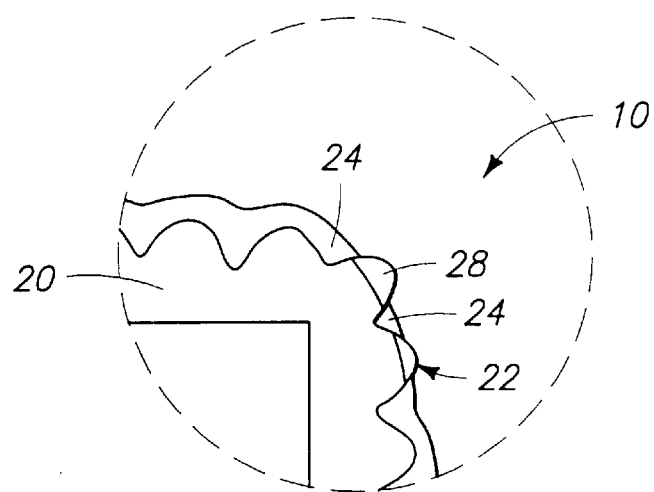
FIG. 3 is a view of the FIG. 2 portion shown at a processing step subsequent to that of FIG. 2.

In accordance with methodology of the present invention, exposed 6 regions 26 are treated by dry oxidation with one or both of NO and $N_2O$ to form a dielectric material from exposed portions 26. FIG. 3 shows the FIG. 2 portion of wafer fragment 10 after treatment with one or both of NO and $N_2O$, whereupon dielectric caps 28 have been formed over previously exposed portions 26 (FIG. 2) of surface 22. The dielectric material of caps 28 comprises one or both of silicon dioxide and silicon nitride. Specifically, regardless of whether NO or $N_2O$ is utilized for dry oxidation of silicon-comprising surface 22, there is potential to form silicon nitride from the nitrogen component, as well as potential to form silicon dioxide from the oxygen component. It can be advantageous to form silicon nitride, as such has a higher dielectric constant than silicon dioxide. However, regardless of whether silicon nitride, silicon dioxide, or both is formed, exposed portions of surface 22 will be protected with a dielectric material cap.

Advantages of utilizing NO and/or $N_2O$ dry oxidation over conventional $O_2$ dry and wet oxidation ($O_2$ and water) can include (1) the NO and/or $N_2O$ treatment can convert an exposed portion of the surface 22 into oxynitride which has a higher dielectric constant than silicon oxide; (2) the reaction of NO and $N_2O$ with the exposed portion of the surface 22 is self-limited, which means that the thickness of the oxynitride or oxide dielectric layer can be very thin and uniform; and (3) the oxynitride or oxide layer formed by NO and/or $N_2O$ oxidation can be denser than oxide formed by $O_2$ or wet oxidation.

It can be desirable for the thickness of the oxynitride or oxide dielectric layer to be thin and uniform because an oxynitride or oxide formed by methodology of the present invention can have a lower dielectric constant and lower leakage that a nitrogen-comprising layer. A combination of a relatively thick nitrogen-comprising layer 24 with a thin oxynitride layer can give better electric performance of an overall dielectric material than would a dielectric material having a thicker oxynitride layer. It is difficult to form an optimum structure on conductive material 20 using $O_2$ dry oxidation or wet oxidation.

It can be desirable to have a dense oxide or oxynitride layer as such can alleviate severe oxidation of conductive material 20 in a subsequent wet oxidation process. Severe oxidation of material 20 can create a thick oxide dielectric layer and reduce capacitance of a capacitor incorporating the dielectric layer due to the lower dielectric constant of the oxide relative to the nitride.

It is noted that even though the invention is described with reference to a method of treating "exposed" portions of a conductive material, it is to be understood that the invention can also be utilized to treat portions of a conductive material which are beneath a very thin portion of nitride layer 24, (with an exemplary very thin portion of nitride layer 24 being a portion which is less than or equal to 5 Å thick), rather than being actually exposed through layer 24.

Dielectric caps 28 can be formed to a thickness of, for example, from about 10 Å to about 30 Å, with an exemplary thickness being about 20 Å. Exemplary dry oxidation conditions comprise a flow rate of from about 0.01 SLM to about 15 SLM of one or both of NO and $N_2O$ a temperature of from about 700° C. to about 850° C., a pressure within the reaction chamber of from about 10 mTorr to about 760 Torr, and a treatment time of from about 5 minutes to about 120 minutes. The NO and/or $N_2O$ can be the only nitrogen-containing materials flowed into the reaction chamber. Alternatively, a nitrogen-comprising carrier gas, such as, for example, $N_2$, can also be flowed into the reaction chamber. Another suitable carrier gas is Ar. An exemplary flow rate of a carrier gas is from about 0.1 SLM to about 20 SLM.

Figure 4:
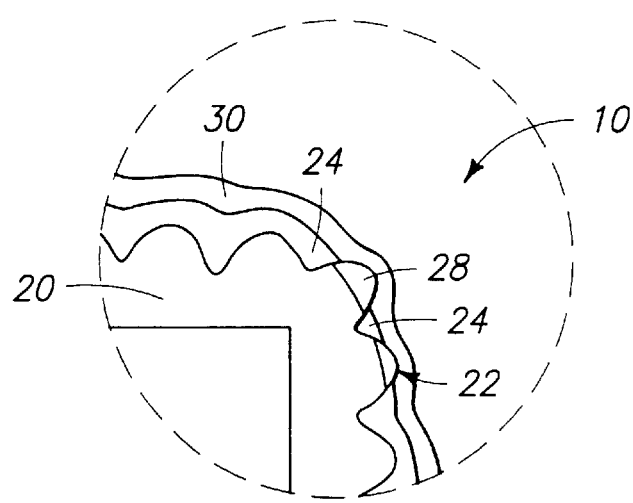
FIG. 4 is a view of the FIG. 2 portion shown at a processing step subsequent to that of FIG. 3.

Referring to FIG. 4, a layer 30 of silicon dioxide is formed over nitrogen-comprising material 24. Layer 30 can comprise, consist essentially of, or consist of silicon dioxide. Layer 30 can be formed by, for example, wet oxidation of surfaces of nitrogen-comprising material 24 and dielectric caps 28. For instance, if layer 24 comprises silicon nitride, and caps 28 comprise one or both of silicon dioxide and silicon nitride, layer 30 can be formed by oxidation of the silicon-comprising surfaces. Such oxidation can comprise wet oxidation utilizing, for example, $O_2$ and water at a temperature of from about 700° C. to about 850° C. Formation of layer 30 can also comprise chemical vapor deposition of silicon dioxide utilizing, for example, tetraethyl orthosilicate (TeOS) as an oxide precursor. The chemical vapor deposition of silicon dioxide can be done alternatively to, or in addition to, wet oxidation. An advantage of utilizing wet oxidation is that such can form Si—O bonds from dangling Si bonds beneath caps 28. More specifically, the dry NO and/or $N_2O$ oxidation described with reference to FIGS. 2 and 3 typically will form Si—N or Si—O bonds from dangling Si bonds near a surface of conductive material 20. The wet oxidation can penetrate deeper than the dry oxidation, and accordingly can form Si—O bonds from dangling bonds that were too deep to be affected by the dry oxidation conditions.

Figure 5:
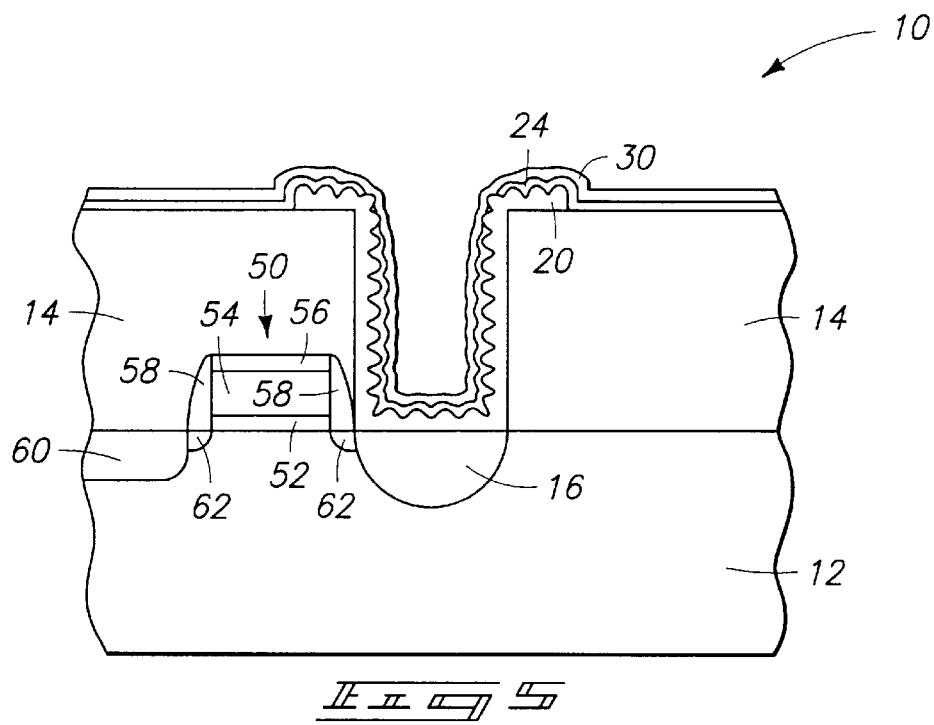
FIG. 5 is a view of the FIG. 1 wafer fragment shown at a processing step corresponding to that of FIG. 4.

Referring to FIG. 5, wafer fragment 10 is shown in a view corresponding to that of FIG. 1, and in a processing step corresponding to that of FIG. 4. Accordingly, wafer fragment 10 comprises nitrogen-comprising layer 24 and silicon dioxide layer 30 formed over first capacitor electrode 20.

Figure 6:
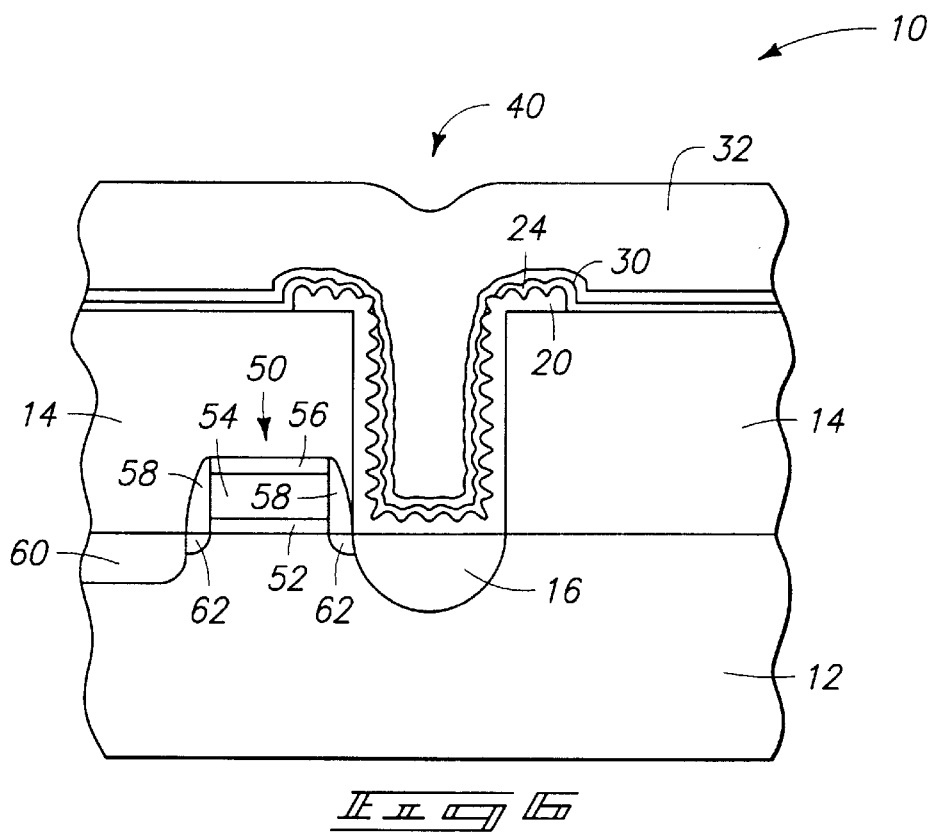
FIG. 6 is a view of the FIG. 1 wafer fragment shown at a processing step subsequent to that of FIG. 5.

Referring to FIG. 6, a second capacitor electrode 32 is formed over silicon dioxide layer 30. Second capacitor electrode 32 comprises a conductive material, and can, for example, comprise conductively doped silicon, such as, for example, conductively doped polysilicon or conductively doped amorphous silicon. Alternatively, second capacitor electrode 32 can comprise metal, such as, for example, a metal alloy or metal silicide. Second electrode 32, first electrode 20, and dielectric layers 24 and 30 together define a capacitor construction 40.

It is to be understood that the processing described above with reference to FIGS. 1–6 is exemplary processing, and that the invention encompasses other embodiments besides those specifically illustrated. For instance, although a silicon dioxide layer 30 is shown being formed over nitride-comprising layer 24, the invention encompasses embodiments wherein layer 30 is not formed, and instead second electrode 32 is formed on nitrogen-comprising layer 24 after the dry oxidation. Also, although the invention is described with reference to formation of a dielectric layer in a capacitor construction, it is to be understood that the invention encompasses formation of dielectric layers in other constructions besides capacitor constructions.

In particular processing, the only layers between first electrode 20 and second electrode 32 are nitrogen-comprising layer 24 and silicon dioxide layer 30. Also, the invention encompasses constructions wherein a first capacitor electrode 20 comprises rugged polysilicon, and wherein such electrode is utilized in a capacitor construction that comprises only one or both of silicon nitride comprising layer 24 and silicon dioxide layer 30 between the first capacitor electrode and a second capacitor electrode.

The capacitor construction of FIG. 6 comprises a junction between first electrode 20 and electrical node 16. Measurements of current flow across such junction can be compared to measurements of current flow across a similar junction formed in a conventional capacitor construction (i.e., a capacitor construction comprising a dielectric material with a layer of silicon nitride formed between a pair of layers of silicon dioxide), to determine if methodology of the present invention adversely affects device performance. Such comparisons have been conducted, and show that devices formed in accordance with the methodology of the present invention can have performance characteristics comparable to, or exceeding those of conventional devices. Accordingly, the formation of silicon nitride layer 30 directly on a silicon-comprising first electrode 20 does not create stresses that destroy device performance.

In alternative processing (not shown), a bit line can be electrically connected with source/drain region 60. Thus, capacitor 40 and transistor structure 50 can together define a DRAM cell.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor structure, comprising:
   a first capacitor electrode comprising a rugged polysilicon layer;
   a first layer extending along and in physical contact with the rugged polysilicon layer, the first layer being a nitrogen-comprising layer; the first layer comprising a pair of segments of silicon nitride separated from one another by an intervening segment of silicon oxynitride;
   a second layer extending along and in physical contact with the first layer, the second layer comprising silicon dioxide; and
   a second capacitor electrode in physical contact with the second layer.

2. The capacitor structure of claim 1 wherein the nitrogen-comprising layer has a thickness of less than or equal to 60 Å.

3. The capacitor structure of claim 1 wherein the nitrogen-comprising layer has a thickness of from about 40 Å to about 60 Å.

4. The capacitor structure of claim 1 wherein the second layer consists essentially of silicon dioxide.

5. The capacitor structure of claim 4 wherein the only dielectric materials between the first and second capacitor electrodes are the nitrogen-comprising layer and the layer consisting essentially of silicon dioxide.

6. The capacitor structure of claim 1 wherein the second layer consists of silicon dioxide.

7. The capacitor structure of claim 6 wherein the only dielectric materials between the first and second capacitor electrodes are the nitrogen-comprising layer and the layer consisting of silicon dioxide.

8. The capacitor structure of claim 1 wherein the first layer physically contacts the rugged polysilicon layer along an entire length of first layer.

9. The capacitor structure of claim 4 wherein the second layer physically contacts the first layer along an entire length of the first layer.

10. The capacitor structure of claim 6 wherein the second layer physically contacts the first layer along an entire length of the first layer.

11. A capacitor structure, comprising:
   a first capacitor electrode comprising a rugged polysilicon layer;
   a nitrogen-comprising layer over the rugged polysilicon layer; the nitrogen-comprising layer including a pair of segments of silicon nitride separated from one another by an intervening segment of silicon oxynitride; and
   a second capacitor electrode over the nitrogen-comprising layer.

12. The capacitor structure of claim 11 further comprising a layer of silicon dioxide between a portion of the nitrogen-comprising layer and the first capacitor electrode.

13. The capacitor structure of claim 11 further comprising a layer of silicon dioxide between the nitrogen-comprising layer and the second capacitor electrode.

14. The capacitor structure of claim 13 wherein the nitrogen-comprising layer has surface against the layer of silicon dioxide, and wherein the surface includes silicon oxynitride of the intervening segment and silicon nitride of the pair of segments.

15. The capacitor structure of claim 11 further comprising:
   a first layer of silicon dioxide between a portion of the nitrogen-comprising layer and the first capacitor electrode; and
   a second layer of silicon dioxide between the nitrogen-comprising layer and the second capacitor electrode.

* * * * *

UNITED STATES PATENT AND TRADEMARK OFFICE
CERTIFICATE OF CORRECTION

| | | |
|---|---|---|
| PATENT NO. | : 6,583,441 B2 | Page 1 of 1 |
| DATED | : June 24, 2003 | |
| INVENTOR(S) | : Behnam Moradi et al. | |

It is certified that error appears in the above-identified patent and that said Letters Patent is hereby corrected as shown below:

Column 3,
Line 45, replace "11 node 16. Material 20 comprises a roughened outer surface" with
-- node 16. Material 20 comprises a roughened outer surface --

Column 4,
Line 27, replace "exposed 6 regions 26 are treated by dry oxidation with one" with
-- exposed regions 26 are treated by dry oxidation with one --
Line 59, replace "leakage that a nitrogen-comprising layer. A combination of" with
-- leakage than a nitrogen-comprising layer. A combination of --

Signed and Sealed this

Twenty-first Day of October, 2003

JAMES E. ROGAN
*Director of the United States Patent and Trademark Office*